United States Patent
Pathirana et al.

(10) Patent No.: US 9,070,735 B2
(45) Date of Patent: Jun. 30, 2015

(54) LATERAL POWER SEMICONDUCTOR TRANSISTORS

(71) Applicant: CAMBRIDGE MICROELECTRONICS LTD., Cambridge (GB)

(72) Inventors: Vasantha Pathirana, Cambridge (GB); Nishad Udugampola, Cambridge (GB); Tanya Trajkovic, Cambridge (GB)

(73) Assignee: Cambridge Microelectronics Ltd., Cambridge (GB)

( * ) Notice: Subject to any disclaimer, the term of this patent is extended or adjusted under 35 U.S.C. 154(b) by 136 days.

(21) Appl. No.: 13/933,736

(22) Filed: Jul. 2, 2013

(65) Prior Publication Data

US 2015/0008481 A1    Jan. 8, 2015

(51) Int. Cl.
    H01L 29/735    (2006.01)
    H01L 29/739    (2006.01)
    H01L 27/06     (2006.01)
    H01L 29/66     (2006.01)
    H01L 29/423    (2006.01)
    H01L 29/08     (2006.01)

(52) U.S. Cl.
    CPC .......... *H01L 29/7393* (2013.01); *H01L 27/067* (2013.01); *H01L 29/66325* (2013.01); *H01L 29/7394* (2013.01); *H01L 29/423* (2013.01); *H01L 29/0834* (2013.01)

(58) Field of Classification Search
    CPC ............ H01L 29/0696; H01L 29/1095; H01L 29/7302; H01L 29/66325; H01L 29/7393; H01L 29/7394; H01L 27/067; H01L 29/0834; H01L 29/423
    USPC .................. 257/140, 162, E29.194, E29.197, 257/E29.027, E21.382, 141; 438/133, 139, 438/140, 135
    See application file for complete search history.

(56) References Cited

U.S. PATENT DOCUMENTS

| | | | |
|---|---|---|---|
| 4,989,058 A | 1/1991 | Colak et al. | |
| 7,605,446 B2* | 10/2009 | Udrea et al. | 257/565 |
| 2006/0261443 A1* | 11/2006 | Udrea | 257/548 |
| 2009/0283796 A1* | 11/2009 | Udrea et al. | 257/139 |
| 2010/0032712 A1* | 2/2010 | Udrea et al. | 257/141 |
| 2011/0057230 A1* | 3/2011 | Udrea et al. | 257/141 |
| 2012/0061726 A1 | 3/2012 | Tokura et al. | |

OTHER PUBLICATIONS

A. Nakagawa et al., "500V Three Phase Inverter ICs Based on a New Dielectric Isolation Technique", ISPSD 1992, pp. 328-332 (cited on p. 3, line 12 of the specification).
T. Terashima, "A Novel Driving Technology for a Passive Gate on a Lateral-IGBT", ISPSD 2009, pp. 45-48 (cited on p. 3, line 19 of the specification).
"Lateral Resurfed Comfet", Electronic Letters, 7th Jun. 1984, vol. 20, No. 12, pp. 519-520.

* cited by examiner

*Primary Examiner* — William F Kraig
*Assistant Examiner* — Pavel Ivanov
(74) *Attorney, Agent, or Firm* — Renner, Otto, Boisselle & Sklar, LLP (57) ABSTRACT

The invention generally relates to a lateral power semiconductor transistor for example in integrated circuits. In particular the invention relates to Lateral Insulated Gate Bipolar Transistors or other lateral bipolar devices such as PIN diodes. The invention also generally relates to a method of increasing switching speed of a lateral bipolar power semiconductor transistor. There is provided a lateral bipolar power semiconductor transistor comprising a first floating semiconductor region of the first conductivity type located laterally spaced to an anode/drain region and a second floating semiconductor region of the second conductivity type located laterally adjacent the first floating semiconductor region, and a floating electrode placed above and in direct contact to the first and second floating semiconductor regions.

20 Claims, 8 Drawing Sheets

FIG. 14

LATERAL POWER SEMICONDUCTOR TRANSISTORS

FIELD OF THE INVENTION

The invention generally relates to a lateral power semiconductor transistor, particularly but not exclusively to a lateral insulated gate bipolar transistor (LIGBT). The invention also generally relates to a method of increasing switching speed of a lateral bipolar power semiconductor transistor.

BACKGROUND TO THE INVENTION

A power semiconductor device is a semiconductor device used as a switch or rectifier in power electronics (e.g. switch-mode power supply). Such a device could be used in an integrated circuit, and the circuit becomes a Power IC, a High Voltage IC or a Smart Power circuit. A power semiconductor device is usually used in "commutation mode" (i.e. it is either on or off), and therefore has a design optimized for such usage.

High power devices used in integrated circuits typically operate with voltages in the range of 20V to 1.2 kV and current levels in the range of 1 mA to 50 A. Their application areas range from portable consumer electronics, domestic appliances, electric cars, motor control and power supplies to RF and microwave circuits and telecommunication systems.

Lateral power devices in integrated circuits (ICs) have the main terminals (anode/drain/collector as the high voltage terminal and cathode/source/emitter as the low voltage terminal) and the control terminal (gate/base) placed at the surface of the device in order to be easily accessible. In power ICs, such devices are often monolithically integrated with CMOS-type or BiCMOS-type low voltage/low power circuits. To minimize the cost, the high voltage power device and the low power CMOS circuits use common layers from the CMOS based process where possible. The drift layer is however specific to high voltage devices and it is commonly built before the CMOS process sequence.

Insulated gate bipolar transistors (IGBTs) belong to a very large group of high voltage power devices available in the market today. They have the combined advantage of a MOS gate drive and high current densities found in bipolar transistors. Electrical conductivity of the drift layer in an IGBT can be sharply increased due to conductivity modulation in the drift region. However, in general, a high level of charge leads to reduced on-state losses but increased switching losses.

Most IGBTs that are currently in the market are based on vertical designs. Vertical designs have the low voltage terminal, commonly called cathode or emitter, and the control terminal called gate, at the surface while the high voltage terminal called anode or collector at the bottom of the device. The vertical devices have high current capability, but they are not CMOS compatible. Lateral Insulated Gate Bipolar Transistors (LIGBTs) have been proposed as early as 1984 (M. Darwish, 'Lateral Resurf COMFET', Electronics Letters, vol. 20, no. 12, 1984), but in contrast to the vertical IGBTs, only a few SOI (Silicon On Insulator) and DI (Dielectric Isolation) solutions have been commercially successful.

The trade-off between the on-state voltage drop and turn-off losses is commonly adjusted in IGBTs by changing the lifetime of the charge carriers in the whole of the drift layer or locally at the drain. Lifetime killing in lateral power devices can be challenging since it can damage the CMOS or Bi-CMOS circuit blocks in an integrated circuit.

Another common approach used to adjust the trade-off between on-state and turn-off losses in IGBTs is based on changing the anode/drain/collector injection efficiency. This has been implemented by changing the doping of the semiconductor layers on either side of the injecting junction (e.g. drain P+ or n-type buffer). Changing the doping of the layers can be very difficult for lateral power devices, because most layers available in a CMOS or bi-CMOS process have doping concentrations dictated by the performance of the CMOS or Bi-CMOS low voltage devices. Moreover, even if some of these changes could be accommodated by introducing extra layers, it would be necessary to re-adjust the trade-off between on-state and switching losses in order for the device to operate more efficiently in a context of a particular application. The process therefore has to be re-tailored to allow this change, which can be expensive and time consuming.

US1991/US4989058 (Sel Colak et al.) reports a method of forming an LIGBT with improved switching performance. The anode/drain regions can be in direct contact with both P+ and N+ regions forming an anode shorted type LIGBT. The N+ region at the anode can be connected with the P+ region through a resistive element, thereby improving the LIGBT on-state. Alternatively a Schottky contact can be formed on the n-buffer instead of the Ohmic contact to anode P+, as a way to control the minority carrier injection and conductivity modulation.

A. Nakagawa et al. '500V Three Phase Inverter ICs Based on a New Dielectric Isolation Technique', ISPSD 1992, pp 328-332 report an LIGBT having an anode structure characterized by an additional N+ region formed in a shallow P-drain layer. This reported structure behaves exactly in the same way as conventional anode shorted structure in the high injection condition. However in the low injection condition, the structure is the same as an ordinary LIGBT.

Terashima et al. 'A Novel Driving Technology for a Passive Gate on a Lateral-IGBT', ISPSD 2009, pp 45-48, investigate the LIGBT performance improvement by the use of a passive gate at the anode/drain side of the device. Passive gate can be driven without the need for additional process or structural change. The passive PMOS, whose gate is tied to a floating electrode, switches with the anode/drain voltage swing simultaneously. Therefore, low on resistance of a normal LIGBT and low turn-off loss of an anode shorted LIGBT can be achieved.

US2011/0057230A1 relates to a method of forming an LIGBT which has improved trade-off between on-state and turn-off losses while suppressing the parasitic thyristor latch-up. Drain/anode P+ doping can be reduced to lower the anode injection. A floating N+ region can be used in front of the drain/anode P+ to enhance the recombination. Alternatively N+ buried layer can be used under the drain/anode P+ to kill the injection of carriers deep into the substrate.

US2012/0061726A1 reports a method of forming an LIGBT having superior performance to the state-of-the-art. This superior performance is achieved by an anode structure consisting of a narrow P+-injector and a wide Schottky contact on a lightly doped P-layer over an n-buffer.

Figure 1:
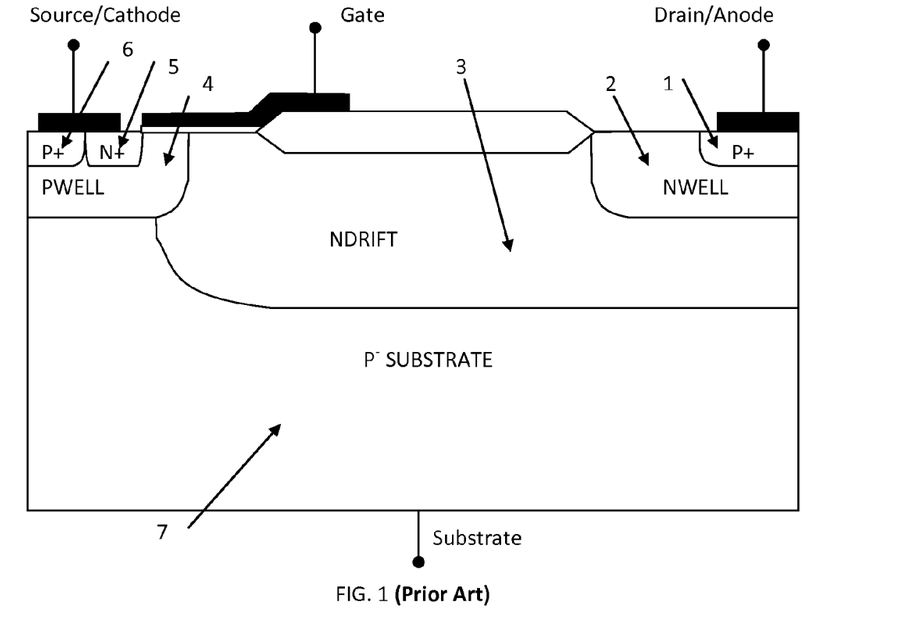
- FIG. 1 shows schematically a cross sectional view of a prior art LIGBT in bulk silicon technology.

FIG. 1 shows schematically a cross-sectional view of a prior art LIGBT in bulk silicon technology. In this figure, an n-type region is formed in a p-type substrate 7 forming a drift region 3 which will be depleted of mobile carriers during the off-state blocking mode to support the breakdown voltage and conduct charge during the on-state conducting mode. A p-type region 1 forms an ohmic contact with a drain electrode. An n-type region 2 surrounds the p-type region 1 and is more highly doped than the drift region 3. The n-type region 2 prevents the punch through breakdown and can also be used to alter LIGBT characteristics. A p-well 4 forms a device channel region. A device gate electrode is placed on top of this region and is separated by a thin oxide. The gate electrode is used to control the charge in the channel region by controlling the flow of charge within the drift region 3. A further n-type region 5 and p-type region 6 are formed within the p-well 4 which are connected together forming the ohmic contact to the device source.

Figure 2:
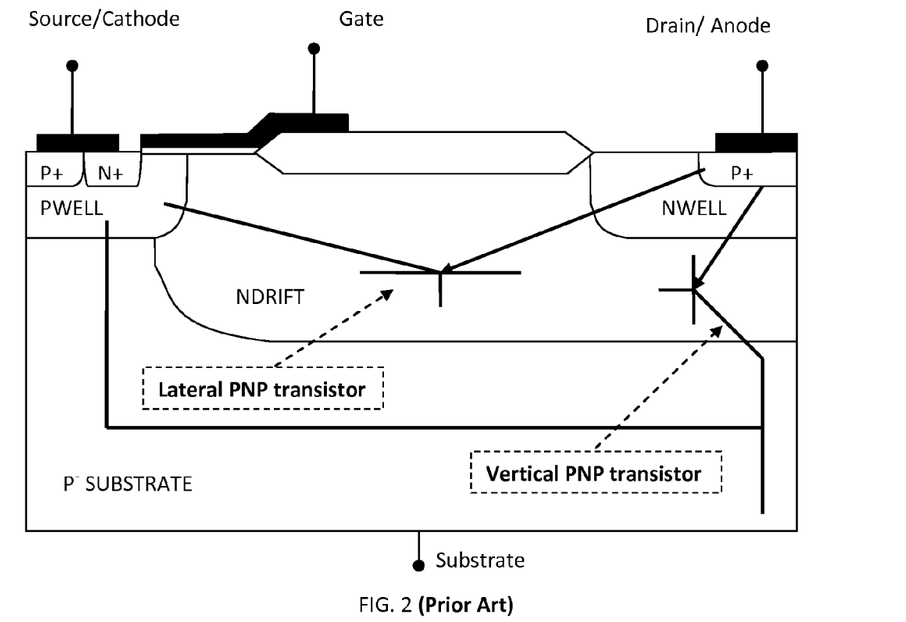
FIG. 2 shows schematically the presence of the two PNP transistors in the prior art LIGBT in bulk silicon technology of FIG. 1.

The LIGBT can be broadly regarded as a low voltage MOSFET, driving a wide based bipolar transistor. Depending on the technology there can be a second bipolar transistor which has a narrow base and a wide collector. FIG. 2 depicts the same LIGBT of FIG. 1 with the two bipolar transistors present in a LIGBT in bulk silicon technology. The vertical PNP transistor often allows injection of plasma deep into the p-substrate. The injection of plasma deep into the p-substrate will lead to slow switching speed and consecutively high switching losses. The switching speeds can be improved by reducing the gain of the PNP transistors. Furthermore by reducing the gain of the PNP transistors the parasitic thyristors in the LIGBT can be suppressed.

Figure 3:
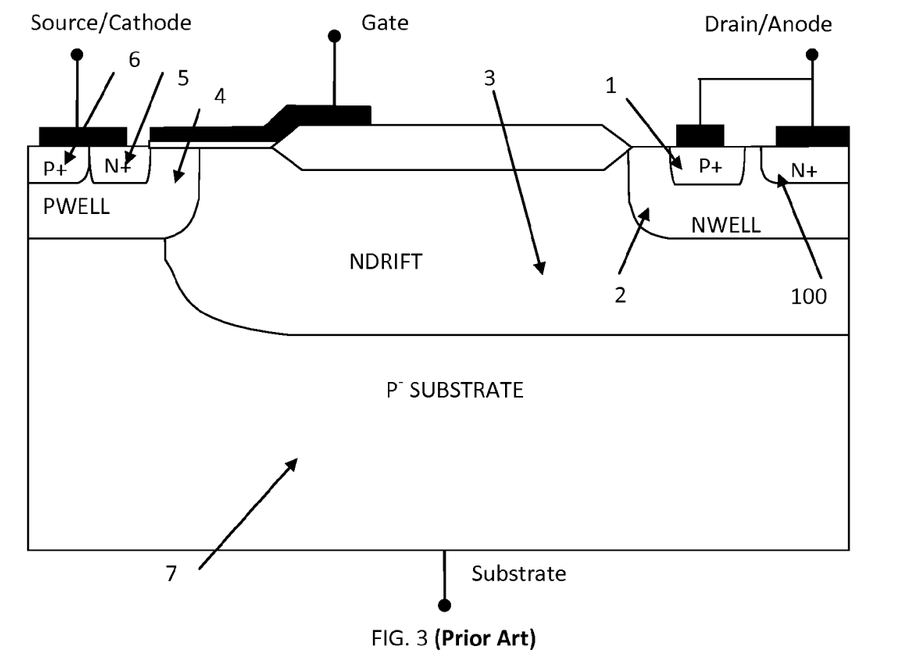
FIG. 3 shows schematically a cross sectional view of a prior art anode shorted LIGBT in bulk silicon technology.
Figure 4:
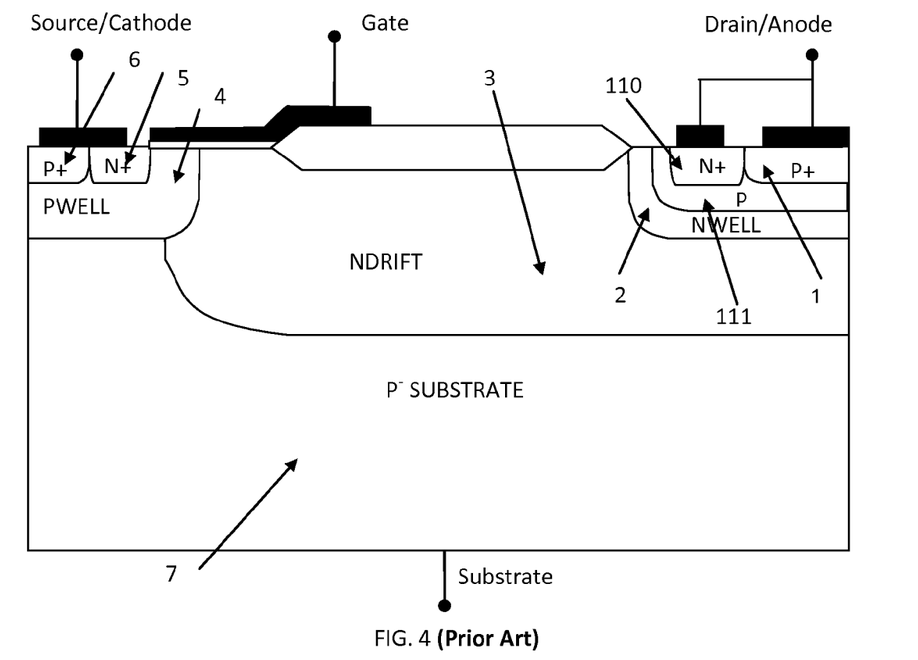
FIG. 4 shows schematically a cross sectional view of a prior art LIGBT optimised for a better on-state vs. turnoff losses trade-off.

FIG. 3 and FIG. 4 depict prior art LIGBT designs proposed to lower the high switching losses present in LIGBTs. Many features of FIGS. 3 and 4 are similar to those shown in FIGS. 1 and 2 and therefore carry the same reference numerals. However, FIG. 3 shows an anode shorted type LIGBT where an N+ region 100 is connected to the drain electrode. This structure has improved switching performance but at the expense of higher conduction losses and snap-back characteristics in the on-state. The device structure on FIG. 4 has an N+ layer 110 in front of a drain P+ layer 1 and it is surrounded by a P-type layer 111. This device will operate without the snap-back type characteristics in the on-state and will have improved switching performance. However this design will require an additional masking layer to form the p-type layer 111.

The field of LIGBTs therefore continues to provide a need for an LIGBT having improved characteristics, for example increased switching speed and/or a wider range of operating conditions (e.g., any combination of one or more predetermined range of continuous and/or switching current between main terminals, voltage between main terminals, junction and/or ambient temperature, etc.).

SUMMARY

According to one aspect of the present invention there is provided a lateral bipolar power semiconductor transistor comprising: a contact region of a first conductivity type located within a first semiconductor region of a second, opposite conductivity type; a source region of the second conductivity type located within a second semiconductor region of the first conductivity type; a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor; a gate placed above the second semiconductor region, the gate to control charge in a channel region between the lateral drift region and the source region of the second conductivity type and to thereby control flow of charge within the lateral drift region; a first floating semiconductor region of the first conductivity type located laterally spaced to the contact region within the first semiconductor region and having a higher doping concentration than the first semiconductor region of the second conductivity type; a second floating semiconductor region of the second conductivity type located laterally adjacent the first floating semiconductor region within the first semiconductor region and having a higher doping concentration than the first semiconductor region of the second conductivity type, and a floating electrode placed above and in direct contact to the first and second floating semiconductor regions.

In common with embodiments of all lateral bipolar transistor aspects of the invention, a lateral bipolar transistor of this first aspect may broadly be viewed as comprising a MOS component driving a bipolar transistor. For example, an n-channel LIGBT may have an n-channel MOSFET driving the base of a lateral PNP transistor.

Advantageously, the floating electrode connected with the first and second floating semiconductor regions remove carriers and therefore act to reduce the gain of the PNP transistors formed in the proposed transistor, thereby reducing the deep injection of carriers into the substrate. This consequently leads to lower switching losses and increased turn-off speed. This proposed structure will therefore improve device switching characteristics and suppress the activation of the parasitic thyristors which is one of the main problems of this type of transistor (a LIGBT).

The transistor may further include a third floating semiconductor region of second conductivity type located laterally adjacent the contact region and the first floating semiconductor region. Preferably the third floating semiconductor region contacts the contact region. The floating electrode may be placed in direct contact to the third floating semiconductor region. It will be appreciated that the third floating semiconductor region may not be connected with the floating electrode. Here the term "laterally adjacent" means next to each other and does not restrict to the meaning that the semiconductor regions are in contact with each other.

The contact region may be a charge injection region and charge injection from the charge injection region may be reduced due to the presence of the first floating semiconductor region, the second floating semiconductor, the third floating semiconductor region and the floating electrode due to decrease in injection efficiency and/or Auger/Shockley-Read-Hall (SRH) recombination.

The first floating semiconductor region, the second floating semiconductor region, the third floating semiconductor region and the floating electrode may be configured to reduce the charge injection of carriers of first conductivity type from the contact region which results in lower plasma formation which is advantageous during the turn-off The width of the second and third floating semiconductor regions may be adjusted to control charge injection from the contact region. The first, second and third floating regions are located between the contact region and the gate.

Advantageously when the floating regions and the floating electrode are between the drain and gate (or are in front of the drain), the injected carrier collection from the floating electrode will be more effective compared to that when the floating regions and floating electrode are behind the drain. Furthermore by changing the widths of the N+ layers (the second and third floating semiconductor regions) connected to the floating electrode, the trade off between the on-state and switching speed can be optimised.

As known, one major problem in LIGBTs is carrier injection deep into the substrate which is generally worse at high temperature. This deep injection of carriers slows down the switching significantly and does not contribute to the on-state. The first semiconductor region (n-well) which surrounds the anode region will help to reduce the deep carrier injection as it is more highly doped compared to the n-drift layer. This will also reduce the PNP transistor gain of the LIGBT. The first semiconductor region will also help to improve the device breakdown by relaxing the electric field at the drift layer/second floating region (connected to the floating electrode) junction, preventing punch through breakdown and reducing the bipolar transistor gain.

It will be also noted that the area and volume of the charge in the first semiconductor region (n-well) is much larger than that of the N+ layer alone. This will act to recombine extra holes which will make the function of the floating layers and floating electrode much more effective (than when the floating layers and floating electrodes are placed outside of the first semiconductor region (n-well)). Furthermore, if the floating layers and the floating electrode were in front of the drain but not within the first semiconductor region (n-well), it would result in premature breakdown as the highly doped N+ layer will stop the depletion region before reaching the n-well.

The transistor may include a semiconductor wafer substrate of the first conductivity type, the semiconductor wafer substrate comprising the lateral drift region. The substrate extends under substantially the entire lateral extent of the transistor.

The transistor may comprise a first PNP transistor having an emitter comprising the contact region, a base of the first PNP transistor comprising the lateral drift region, and a collector region comprising the semiconductor wafer substrate; and a second PNP transistor having an emitter comprising the contact region, a base of said second PNP transistor comprising the lateral drift region, and a collector region comprising the second semiconductor region.

Preferably the first floating semiconductor region, the second floating semiconductor region and the floating electrode are configured to remove both electrons and holes to reduce current gain of the first and second PNP transistors and to reduce charge injection into the lateral drift region and the substrate.

The transistor may comprise a silicon-on-insulator (SOI) or partial silicon-on-insulator substrate. A lateral insulated gate bipolar transistor (LIGBT) may incorporate the transistor.

According to a further aspect of the invention, there is provided a method of increasing switching speed of a lateral power semiconductor transistor, the transistor comprising: a contact region of a first conductivity type located within a first semiconductor region of a second, opposite conductivity type; a source region of the second conductivity type located within a second semiconductor region of the first conductivity type; a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor; and a gate placed above the second semiconductor region, the gate to control charge in a channel region between the lateral drift region and the source region of the second conductivity type and to thereby control flow of charge within the lateral drift region; said method comprising: forming a first floating semiconductor region of the first conductivity type within the first semiconductor region, the first floating semiconductor region being located in a lateral direction to the contact region and having a doping concentration higher than the first semiconductor region of the second conductivity type; forming a second floating semiconductor region of the second conductivity type within the first semiconductor region, the second floating semiconductor region being located laterally adjacent the first floating semiconductor region and having a higher doping concentration than the first semiconductor region of the second conductivity type, and forming a floating electrode placed above and in direct contact to the first and second floating semiconductor regions.

According to a further aspect of the present invention, there is provided a lateral bipolar power semiconductor transistor comprising: a contact region of a first conductivity type located within a first semiconductor region of a second, opposite conductivity type; a source region of the second conductivity type located within a second semiconductor region of the first conductivity type; a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor; a gate placed above the second semiconductor region, the gate to control charge in a channel region between the lateral drift region and the source region of the second conductivity type and to thereby control flow of charge within the lateral drift region; at least one floating structure comprising at least two floating semiconductor regions of opposite conductivity types and a floating electrode which is placed above and in direct contact with the at least two floating semiconductor regions, the at least one floating structure being located within the first semiconductor region, wherein the contact region is a charge injection region and the floating electrode of the at least one floating structure is configured to remove both electrons and holes to reduce charge injection from the charge injection region.

One of the at least two floating semiconductor regions may be formed laterally spaced to the contact region. Each of the at least two floating semiconductor regions may have a higher doping concentration than the first semiconductor region of the second conductivity type.

According to a further aspect of the present invention, there is provided a lateral bipolar power semiconductor transistor comprising: a contact region of a first conductivity type located within a first semiconductor region of the first conductivity type; a second contact region of a second, opposite conductivity type located within a second semiconductor region of the second conductivity type; a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor; wherein at least one of the first and second semiconductor regions comprises: a first floating semiconductor region of the first conductivity type within a semiconductor well region and having a higher doping concentration than the semiconductor well region; a second floating semiconductor region of the second conductivity type located laterally adjacent the first floating semiconductor region within the semiconductor well region and having a higher doping concentration than the semiconductor well region, and a floating electrode placed above and in direct contact to the first and second floating semiconductor regions.

Preferably the semiconductor well region comprises the second conductivity type when located in the first semiconductor region. The semiconductor well region may comprise the first conductivity type when located in the second semiconductor region.

A P-region/intrinsic-region/N-region (PiN) diode may incorporate the transistor.

BRIEF DESCRIPTION OF THE DRAWINGS

The present disclosure will be understood more fully from the detailed description that follows and from the accompa

DETAILED DESCRIPTION OF PREFERRED EMBODIMENTS

The following describes arrangements falling within the broader aspects of the present invention summarised above, and more specific embodiments.

Embodiments are particularly concerned with high voltage semiconductor devices which can be used in power integrated circuits and have particular application to MOS-bipolar transistors.

Figure 5:
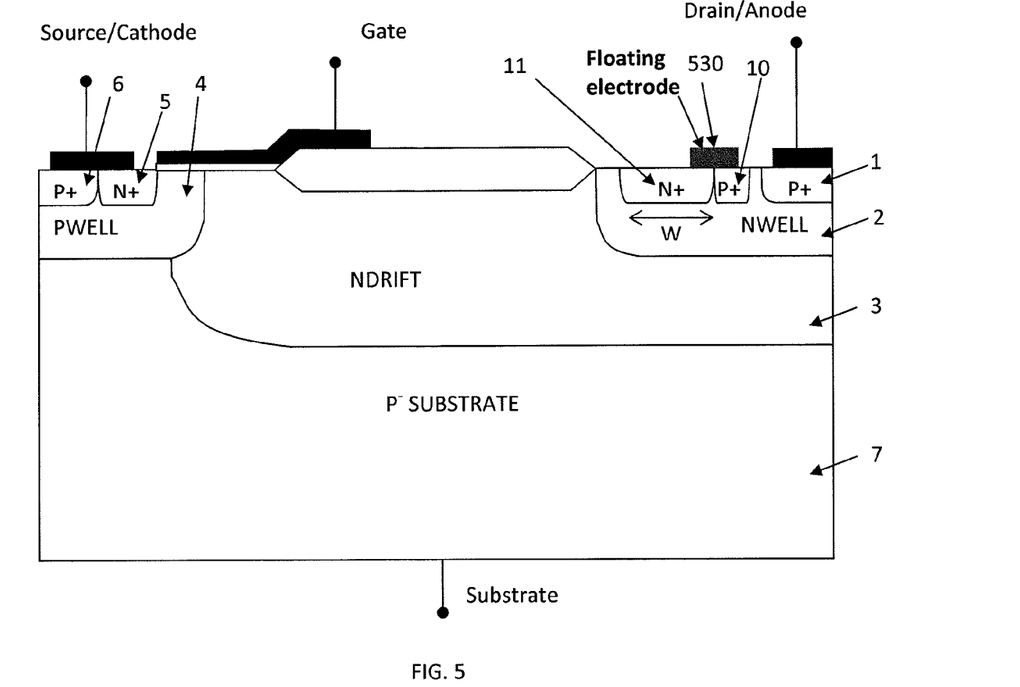
FIG. 5 shows the cross sectional view of a LIGBT according to one embodiment of the invention.

FIG. 5 shows the cross sectional view of a LIGBT according to one embodiment of the invention. In this embodiment, the LIGBT includes a substrate region 7 having high resistivity; a drift layer 3 formed in the substrate region 7 and resistivity of this layer 3 dependent on the off state blocking voltage of the LIGBT. The LIGBT further includes a p-well layer 4 formed at the common surface of the drift layer 3 and substrate 7; a source layer 5 formed at the surface of the p-well layer 4; a body layer 6 formed at the surface of the p-well layer 4; and a source electrode which is ohmic is arranged in contact with the source and body layers 5, 6. A gate electrode facing, through a gate insulating film, a surface of the p-well layer is interposed between the source layer 5 and the drift layer 3. An n-well layer 2 with lower resistivity than the drift layer 3 is formed in the drift layer 3. A P+ drain layer 1 is formed at the surface of the n-well layer 2. A drain electrode which is ohmic is arranged in contact with the drain layer 1. In this embodiment, a P+ floating layer 10 is formed at the surface of the n-well layer 2 and interposed between the drain layer 1 and the drift layer 3. An N+ floating layer 11 is formed at the surface of the n-well layer 2 and can be in contact with the P+ floating layer 10. A floating electrode 530 is arranged to contact both the floating layers 10, 11. The P+ floating layer 10 is generally spaced apart from the anode region 1.

Figure 6:
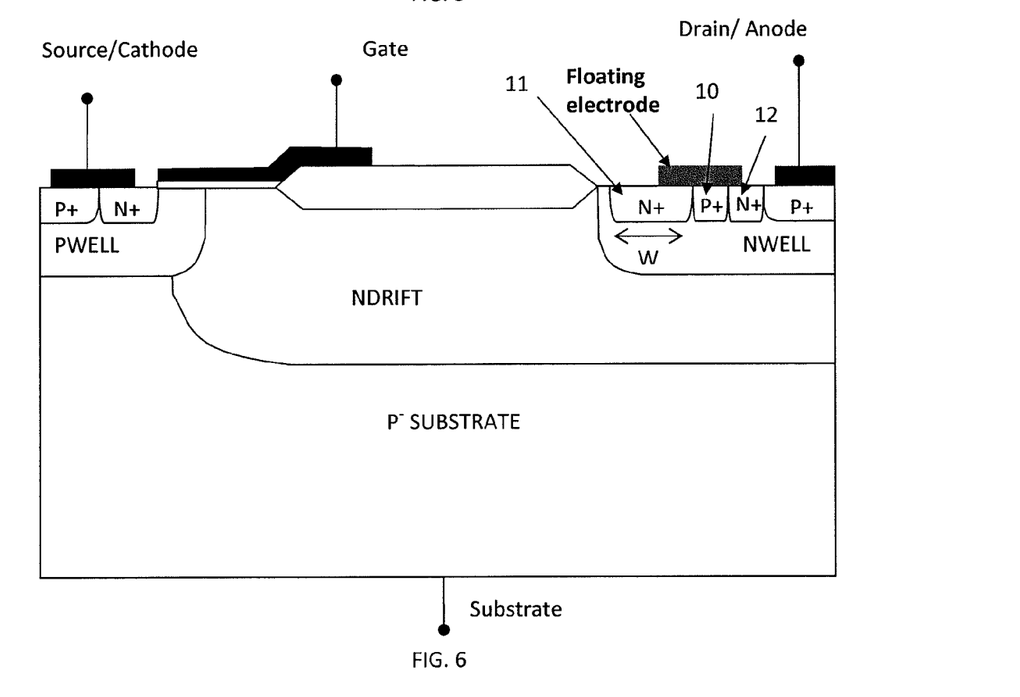
FIG. 6 shows the cross sectional view of a LIGBT according to a further embodiment of the invention.

FIG. 6 shows the cross sectional view of a LIGBT according to a further embodiment of the invention. Many features of this embodiment are the same as those shown in FIG. 5 and therefore carry the same reference numerals. However, a further N+ floating layer 12 is inserted between the P+ floating layer 10 and the anode region. The further N+ floating layer 12 is also connected to the floating electrode. The further N+ floating region can generally contact the P+ anode region (although not essential). The P+ and N+ layers 10, 11, 12 connected to the floating electrode 530 can be the same P+ and N+ layers used in other CMOS circuitry.

Figure 7:
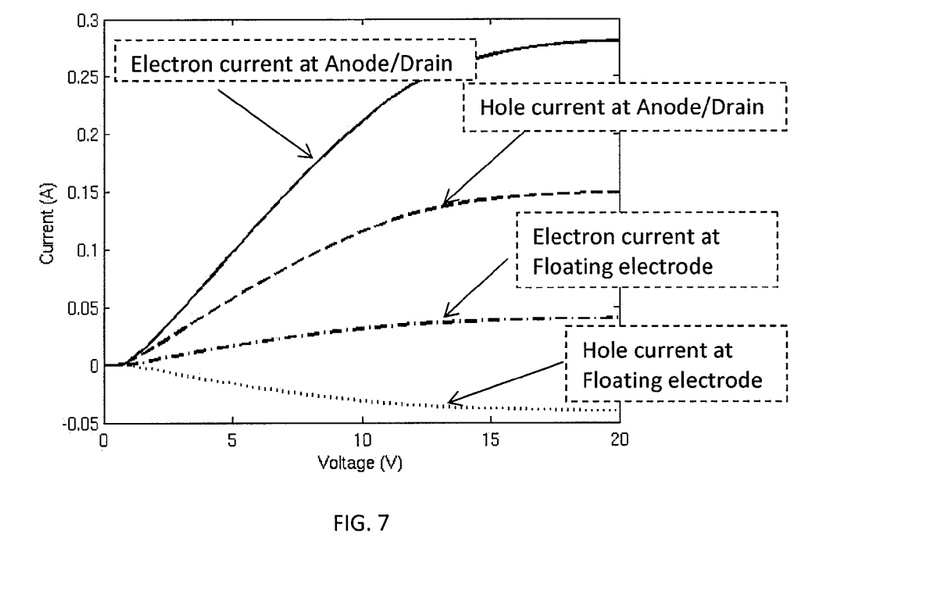
FIG. 7 shows the electron and hole current components at the drain and floating electrode in the on-state of the proposed LIGBT structure.

FIG. 7 shows the electron and hole current components at the drain and floating electrode in the on-state of the LIGBT structure, for example, of FIG. 5. In this plot positive current means a current that flows from the high voltage terminal (anode/drain) towards the low voltage terminal (cathode/source). Positive hole current shows hole injection into the device while positive electron current shows electron removal from the device. At the floating electrode 530 the hole current has a reverse direction (to that in the anode/drain terminal) which indicates removal of the holes (as opposed to injection of holes) while the electron current shows the same direction (to that in the anode/drain terminal) indicating removal of electrons as shown on FIG. 8. The floating terminal will therefore remove both electrons and holes and hence act to reduce the gain of the PNP transistors, thereby reducing the deep injection of carriers into the substrate. This consequently leads to lower switching losses and increased turn-off speed. This proposed structure will therefore improve device switching characteristics and suppress the activation of the parasitic thyristors.

Figure 8:
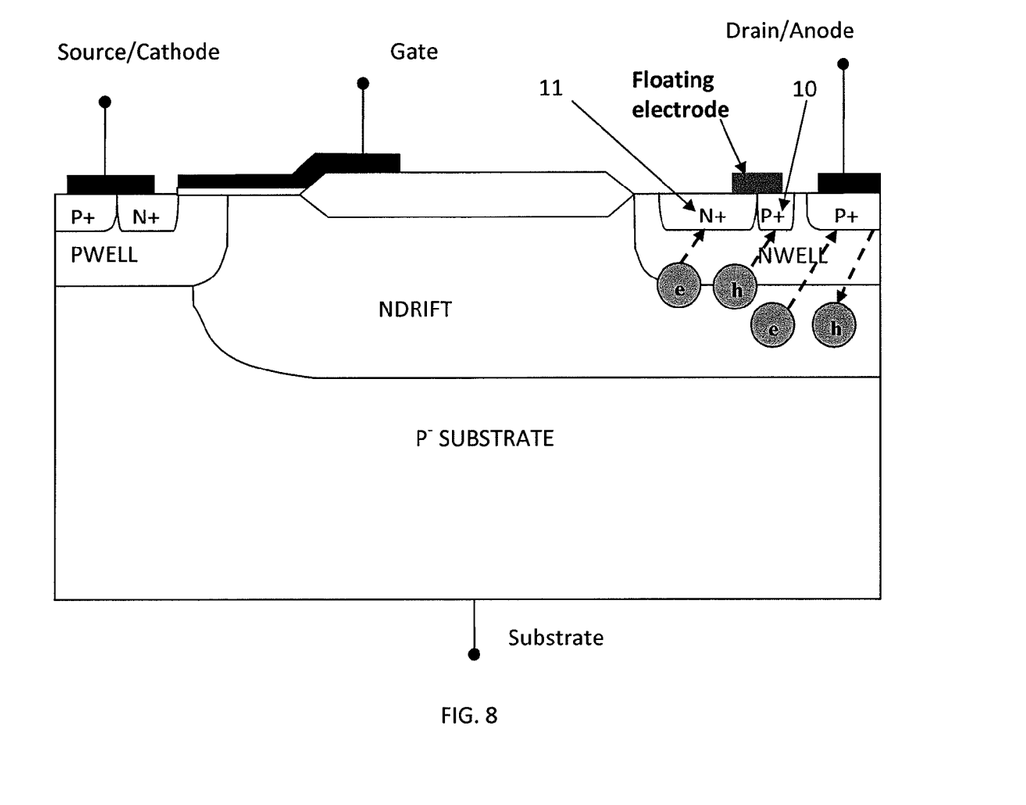
FIG. 8 depicts the electron and hole injection at the drain electrode and floating electrode in the proposed structure.

The N+ layer/layers 11, 12 at the floating terminal 530 will also help to reduce the carrier injection by recombination as this is a very highly doped layer. In particular Auger recombination which is visible only at very high doping levels will be dominant at the N+ layer/layers 11, 12 and will help to reduce the plasma injection into the drift region and substrate. The width (W) of the N+ layer 11 can be adjusted to control the injection level.

Figure 9:
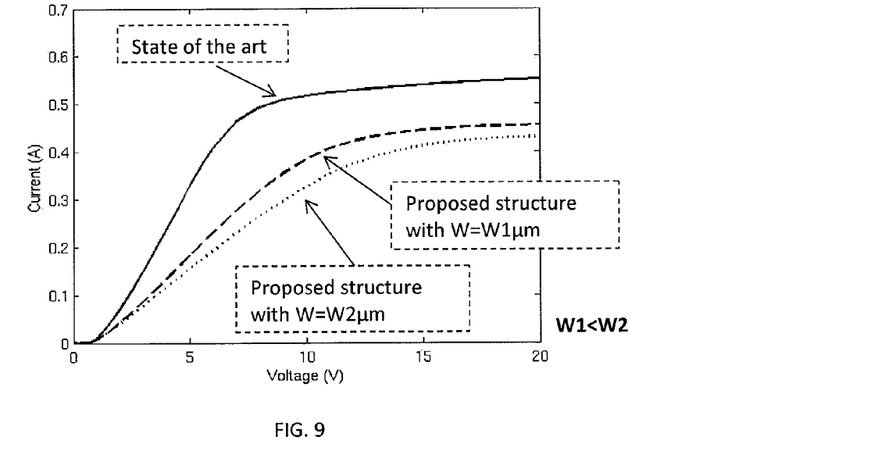
FIG. 9 compares the on-state current in the proposed structure with the state of the art LIGBT at 125° C.

FIG. 9 shows the on-state curves for the state of the art LIGBT and two variants from the proposed structure at 125° C.

Figure 10:
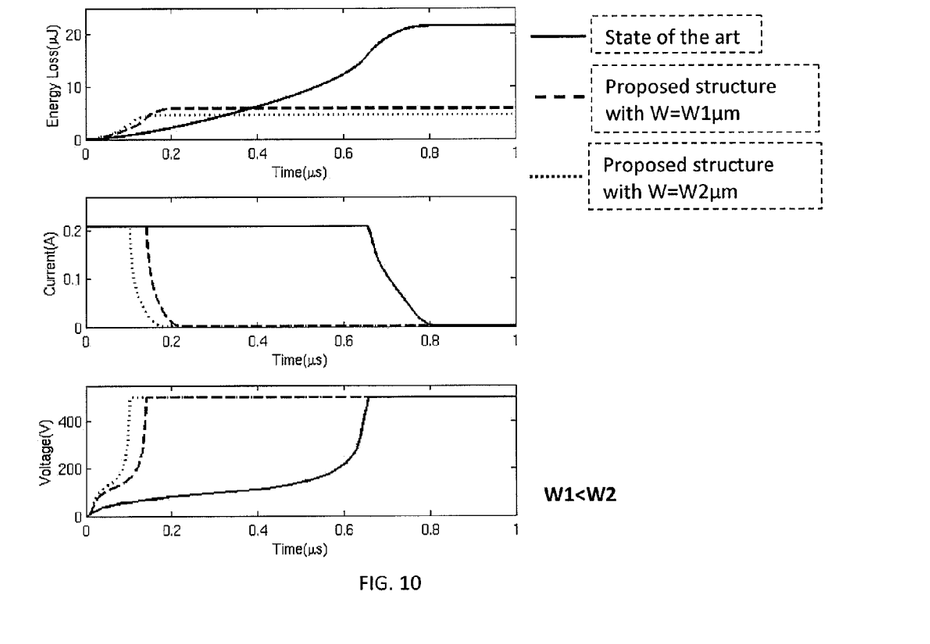
FIG. 10 compares the switching curves in the proposed structure with the state of the art LIGBT at 125° C.

FIG. 10 shows the switching curves for the same devices at 125° C. With the proposed LIGBT structure the switching losses can be reduced by more than four times compared to the state of the art LIGBT.

Figure 11:
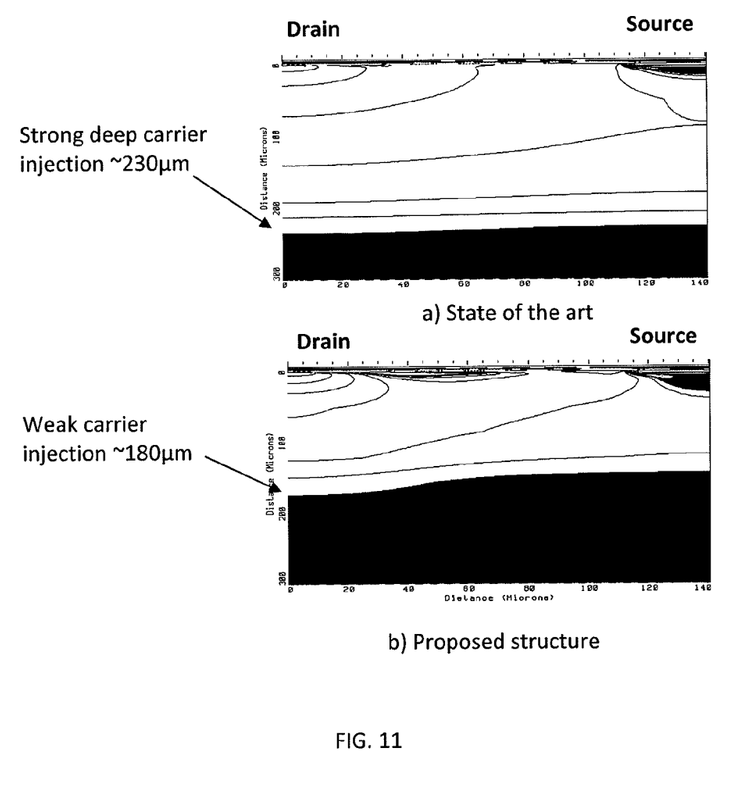
FIG. 11 compares the hole distribution contours for the proposed structure based on first embodiment with the state of the art LIGBT at the same current level.

FIG. 11 is a plot of the hole distribution contours at the same current level for the state of the art LIGBT and the proposed structure. It clearly shows that state of the art LIGBT device has a much stronger injection of carriers deep into the substrate compared to the proposed structure. The floating electrode structure will reduce the on-state current but increase in the conduction losses will be less significant compared to decrease in the turn-off losses.

Figure 12:
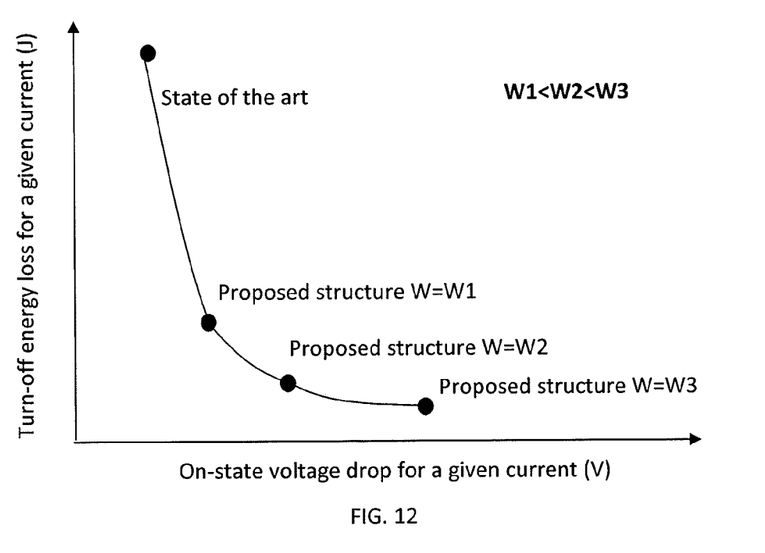
FIG. 12 shows schematically the trade-off between energy loss and on-state voltage drop for the proposed structure and state of the art LIGBT.

FIG. 12 shows a typical on-state vs. turn-off trade off curve and it shows how the width W of the floating N+ region can be used to optimise the device for a specific application. This design feature will allow layout-based fine tuning of conduction vs. switching losses.

Figure 13:
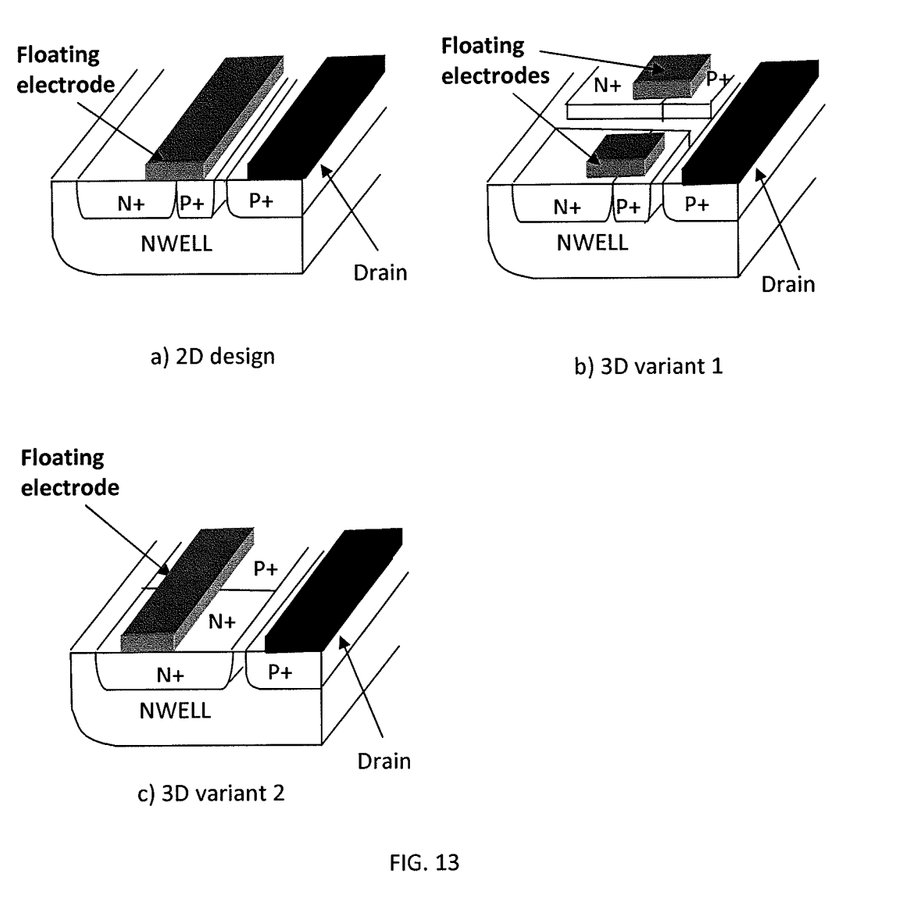
FIG. 13 shows schematically some 3D variants to the present invention.

Variants on the floating electrode together with N+ and P+ regions can be done in the third dimension to achieve different on-state vs. turn-off trade-off curves. Few such examples are shown in FIG. 13.

This embodiment of the LIGBT can also be used in conjunction with other lateral IGBT technologies such as Silicon on Insulator (SOI) and Dielectric Isolation (DI) technologies. Although the present specification generally discusses an n-channel LIGBT, the same concept can be applied to a p-channel LIGBT.

Figure 14:
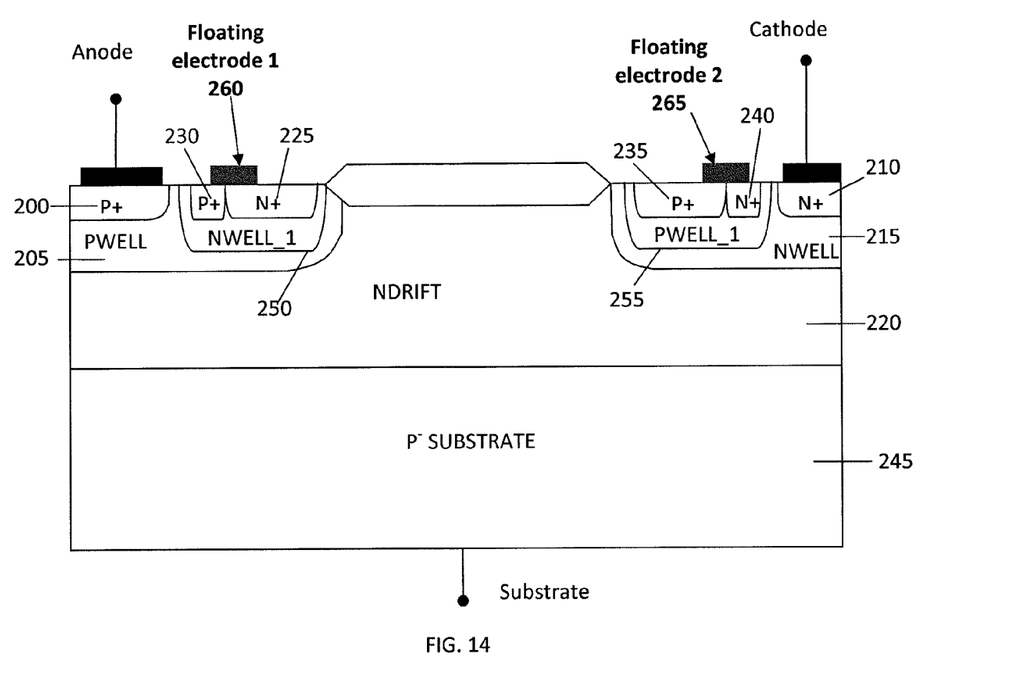
FIG. 14 shows schematically a PIN diode according to an alternative embodiment of the present invention.

The principle of the present invention is also applicable to other lateral power devices such as a P-region/intrinsic-region/N-regin (PiN) diode. Such a PiN diode is illustrated in FIG. 14. The PiN diode includes a p-well 205 formed on a substrate 245. The p-well 205 includes an anode region 200 (or the P-region of the PiN diode) and an n-well 250 spaced from the anode region 200. The n-well 250 includes a P+ floating region 230 and an N+ floating region 225 connected together to a floating electrode 260. The diode includes a drift region 220 in which an n-well 215 is formed. The drift region 220 forms the intrinsic region of the PiN diode. The n-well 215 includes a cathode region 210 (or the N-region of the PiN diode) and a p-well 255 spaced from the cathode region 210. Within the p-well 255, a P+ floating region 235 and an N+ floating region 240 are formed and connected to a floating electrode 265. The proposed PiN diode including the floating regions demonstrates superior switching performance compared with any conventional PiN diodes.

It will be appreciated that the layout of the floating electrode and N+/P+ layers connected to each other is not limited to what has been presented as hereinbefore as long as the concept is the same.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Arrangements and more specific embodiments of the present invention have been described with particular reference to the examples illustrated. However, it will be appreciated that variations and modifications may be made to the examples described within the scope of the present invention, and no doubt many other effective alternatives will occur to the skilled person. It will thus be understood that the invention is not limited to the described embodiments and encompasses modifications apparent to those skilled in the art lying within the spirit and scope of the claims appended hereto.

The invention claimed is:

1. A lateral bipolar power semiconductor transistor comprising:
   a contact region of a first conductivity type located within a first semiconductor region of a second, opposite conductivity type;
   a source region of the second conductivity type located within a second semiconductor region of the first conductivity type;
   a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor;
   a gate placed above the second semiconductor region, the gate to control charge in a channel region between the lateral drift region and the source region of the second conductivity type and to thereby control flow of charge within the lateral drift region;
   a first floating semiconductor region of the first conductivity type located laterally spaced with respect to the contact region, located within the first semiconductor region, and having a higher doping concentration than the first semiconductor region of the second conductivity type;
   a second floating semiconductor region of the second conductivity type located laterally adjacent the first floating semiconductor region, located within the first semiconductor region, and having a higher doping concentration than the first semiconductor region of the second conductivity type, and
   a floating electrode placed above and in direct contact with the first and second floating semiconductor regions.

2. A transistor according to claim 1, further comprising a third floating semiconductor region having the second conductivity type located laterally adjacent the contact region and the first floating semiconductor region.

3. A transistor according to claim 2, wherein the floating electrode is placed in direct contact to the third floating semiconductor region.

4. A transistor according to claim 1, wherein the contact region is a charge injection region and charge injection from the charge injection region is reduced due to the presence of the first floating semiconductor region, the second floating semiconductor region and the floating electrode due to decrease in injection efficiency and/or Auger/Shockley-Read-Hall (SRH) recombination.

5. A transistor according to claim 1, wherein the first floating semiconductor region, the second floating semiconductor region and the floating electrode are configured to reduce the charge injection of carriers of first conductivity type from the said contact region which results in lower plasma formation.

6. A transistor according to claim 1, wherein the width of the second floating semiconductor region is adjusted to control charge injection of first conductivity type from the contact region.

7. A transistor according to claim 1, wherein the first and second floating regions and the floating electrode are located between the contact region and the gate.

8. A transistor according to claim 1, comprising a semiconductor wafer substrate of the first conductivity type, the semiconductor wafer substrate comprising the lateral drift region, wherein the substrate extends under substantially the entire lateral extent of the transistor.

9. A transistor according to claim 8, comprising:
   a first PNP transistor having an emitter comprising the contact region, a base of the first PNP transistor comprising the lateral drift region, and a collector region comprising the semiconductor wafer substrate; and
   a second PNP transistor having an emitter comprising the contact region, a base of said second PNP transistor comprising the lateral drift region, and a collector region comprising the second semiconductor region.

10. A transistor according to claim 9, wherein the first floating semiconductor region, the second floating semiconductor region and the floating electrode are configured to remove both electron and holes to reduce current gain of the first and second PNP transistors and to reduce charge injection into the lateral drift region and the substrate.

11. A transistor according to claim 1, comprising a silicon-on-insulator (SOI) or partial silicon-on-insulator substrate.

12. A lateral insulated gate bipolar transistor (LIGBT) incorporating the transistor according to claim 1.

13. A method of increasing switching speed of a lateral power semiconductor transistor, the transistor comprising:
   a contact region of a first conductivity type located within a first semiconductor region of a second, opposite conductivity type;

a source region of the second conductivity type located within a second semiconductor region of the first conductivity type;

a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor; and a gate placed above the second semiconductor region, the gate to control charge in a channel region between the lateral drift region and the source region of the second conductivity type and to thereby control flow of charge within the lateral drift region;

the method comprising:

forming a first floating semiconductor region of the first conductivity type within the first semiconductor region, the first floating semiconductor region being located laterally spaced to the contact region and having a higher doping concentration than the first semiconductor region of the second conductivity type;

forming a second floating semiconductor region of the second conductivity type within the first semiconductor region, the second floating semiconductor region being located laterally adjacent the first floating semiconductor region and having a higher doping concentration than the first semiconductor region of the second conductivity type, and forming a floating electrode placed above and in direct contact to the first and second floating semiconductor regions.

14. A lateral bipolar power semiconductor transistor comprising:

a contact region of a first conductivity type located within a first semiconductor region of a second, opposite conductivity type;

a source region of the second conductivity type located within a second semiconductor region of the first conductivity type;

a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor;

a gate placed above the second semiconductor region, the gate to control charge in a channel region between the lateral drift region and the source region of the second conductivity type and to thereby control flow of charge within the lateral drift region;

at least one floating structure comprising at least two floating semiconductor regions of opposite conductivity types and a floating electrode which is placed above and in direct contact with the at least two floating semiconductor regions, the at least one floating structure being located within the first semiconductor region, wherein the contact region is a charge injection region and the floating electrode of the at least one floating structure is configured to remove both electrons and holes to reduce charge injection from the charge injection region.

15. A transistor according to claim 14, wherein one of the at least two floating semiconductor regions is formed laterally spaced to the contact region.

16. A transistor according to claim 15, wherein each of the at least two floating semiconductor regions has a higher doping concentration than the first semiconductor region of the second conductivity type.

17. A lateral bipolar power semiconductor transistor comprising:

a contact region of a first conductivity type located within a first semiconductor region of the first conductivity type;

a second contact region of a second, opposite conductivity type located within a second semiconductor region of the second conductivity type;

a lateral drift region of the second conductivity type placed between the first semiconductor region and the second semiconductor region, the lateral drift region to be depleted of mobile carriers at breakdown voltage during an off-state blocking mode of the transistor and able to conduct charge during an on-state conducting mode of the transistor;

wherein at least one of the first and second semiconductor regions comprises:

a first floating semiconductor region of the first conductivity type within a semiconductor well region and having a higher doping concentration than the semiconductor well region;

a second floating semiconductor region of the second conductivity type located laterally adjacent the first floating semiconductor region within the semiconductor well region and having a higher doping concentration than the semiconductor well region, and a floating electrode placed above and in direct contact to the first and second floating semiconductor regions.

18. A transistor according to claim 17, wherein the semiconductor well region is of the second conductivity type when located in the first semiconductor region.

19. A transistor according to claim 17, wherein the semiconductor well region is of the first conductivity type when located in the second semiconductor region.

20. A P-region/intrinsic-region/N-region (PiN) diode incorporating the transistor according to claim 17.

* * * * *